US007239845B2

(12) United States Patent
Ollis et al.

(10) Patent No.: US 7,239,845 B2
(45) Date of Patent: *Jul. 3, 2007

(54) USER INTERFACE FOR SMART WIRELESS TRANSFER

(75) Inventors: Joseph K. Ollis, Bellevue, WA (US); Andrew W. Jacobs, Seattle, WA (US)

(73) Assignee: Microsoft Corporation, Redmond, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/464,054

(22) Filed: Aug. 11, 2006

(65) Prior Publication Data

US 2006/0291474 A1 Dec. 28, 2006

Related U.S. Application Data

(63) Continuation of application No. 11/305,615, filed on Dec. 16, 2005, now Pat. No. 7,113,747, which is a continuation of application No. 10/051,528, filed on Jan. 17, 2002, now Pat. No. 6,999,721.

(51) Int. Cl.
*H04B 5/00* (2006.01)
*H04B 7/00* (2006.01)
*H04M 1/00* (2006.01)

(52) U.S. Cl. ............... 455/41.2; 455/552.1; 455/553.1; 455/556; 455/557

(58) Field of Classification Search .............. 455/41.1, 455/41.2, 552.1, 553.1, 556, 557, 559, 3.02, 455/3.03, 3.06, 13.1, 12.1, 13.4
See application file for complete search history.

(56) References Cited

U.S. PATENT DOCUMENTS 6,665,521 B1* 12/2003 Gorday et al. ........... 455/67.11
6,694,143 B1* 2/2004 Beamish et al. ......... 455/456.1
6,748,195 B1* 6/2004 Phillips .................... 455/41.2

\* cited by examiner

*Primary Examiner*—Matthew D. Anderson
*Assistant Examiner*—Yuwen Pan
(74) *Attorney, Agent, or Firm*—Workman Nydegger

(57) ABSTRACT

A source wireless device is capable of transmitting items over a wireless network using a number of different wireless transfer mechanism such as, for example, Infra-Red (IR) or Bluetooth. Several potential destination wireless devices may be capable of receiving the item using at least one of the different wireless transfer mechanisms. The user selects one or more destination wireless devices to send items to using a unified user interface that lists the various potential destination wireless devices. After a user selects items to transfer as well as the destination wireless device(s), the wireless transfer mechanism appropriate for transfer to each device is then automatically identified without requiring user selection of the particular wireless transfer mechanism.

13 Claims, 4 Drawing Sheets

USER INTERFACE FOR SMART WIRELESS TRANSFER

PRIORITY PARAGRAPH

This application is a continuation of application Ser. No. 11/305,615, filed Dec. 16, 2005, and entitled "UNIFIED CONTACT TRANSFER FOR MULTIPLE WIRELESS TRANSFER MECHANISMS, which is a continuation of U.S. Pat. No. 6,999,721, filed Jan. 17, 2002, and entitled "UNIFIED OBJECT TRANSFER FOR MULTIPLE WIRELESS TRANSFER MECHANISMS", both of which are incorporated herein by reference. This application claims the benefit and priority of both of the foregoing applications.

BACKGROUND OF THE INVENTION

1. The Field of the Invention

The present invention relates to the field of wireless transfer mechanisms. Specifically, the present invention relates to methods, systems and computer program products for transferring objects using one of multiple wireless transfer mechanisms without requiring that a user specify a wireless transfer mechanism.

2. Background and Related Art

Computers have revolutionized modern life. Advances in computing technology result in more powerful and portable computing devices such as laptop computers and hand-held computers (also called "personal digital assistants"). In addition, some mobile telephones have computing power and thus may also be considered computing devices. These devices are often collectively referred to as "portable computing devices".

It is often desirable to connect such portable computing devices with other devices or with a network in order to transfer or receive information. Due to their portable nature, a number of wireless transfer mechanisms are currently employed to provide such connectivity.

One group of transfer mechanisms involves the transfer of information in the Infra-Red or "IR" range of the frequency spectrum. Various standards exist for transferring objects over IR. One standard is called the "IrDA Object Exchange Protocol" (also called "IrOBEX") published by the INFRA-RED DATA ASSOCIATION$^{SM}$. Conventionally, object exchange occurs over IR by pointing an IR transmitter from the sending device towards an IR receiver of the receiving device.

More recently, a wireless transfer mechanism called BLUETOOTH™ has been introduced. Bluetooth is a specification for using low-power radio to link wireless computing devices over short distances. A Bluetooth compatible computing device can automatically detect the presence of other Bluetooth compatible computing devices in the general proximity. Then, object exchange between those devices is possible also using Bluetooth. Other types of wireless networking exist such as the IEEE 802.11b standard also known as "Wi-Fi".

Many computing devices may use IR, Bluetooth, other wireless transfer mechanisms or a combination thereof to transfer objects between computing devices. Those computing devices that use both wireless transfer mechanisms conventionally have a user interface for sending objects with IR, and a user interface for sending objects with Bluetooth. Thus, a user must select the wireless transfer mechanism to use when sending an object. However, a user does not often care what wireless transfer mechanism is used to transfer an object from one computing device to another. All that the user often cares about is that the object that the user selected for transfer is indeed transferred.

Accordingly, what is desired are systems, methods and computer program products for transferring objects using one of multiple wireless transfer mechanisms without requiring that the user designate a particular wireless transfer mechanism.

SUMMARY OF THE INVENTION

Methods, systems and computer program products are described for providing a unified object transfer mechanism in a wireless environment in which multiple wireless transfer mechanisms may be possible. In particular, a wireless network may include a number of wireless devices. One of the wireless devices (i.e., a "source wireless device") is to transfer one or more items to one or more of the other wireless devices in the wireless network. Thus, each of the other wireless devices are potential recipients of the items to be transferred and are thus called "potential destination wireless devices".

The source wireless devices is capable of transmitting the items over the wireless network using a number of different wireless transfer mechanisms such as, for example, Infra-Red (IR), Bluetooth, or other wireless technologies whether now existing or to be developed in the future. The potential destination wireless devices are capable of receiving the item using at least one of the different wireless transfer mechanisms. In accordance with the principles of the present invention, a user may select one or more destination wireless devices to send the items to, without having to be concerned about the particular wireless mechanism to use when transferring the item.

The source wireless device displays a unified user interface that presents the potential destination wireless devices to the user regardless of the wireless transfer mechanisms that are available to each of the potential destination wireless devices. The source wireless device then receives a user selection designating which of the potential destination wireless devices are selected to be actual destination wireless devices. Then, the source wireless device automatically identifies wireless transfer mechanisms to use when transferring the items to each of the selected destination devices.

All this is performed without requiring that the user specify a wireless transfer mechanism. In conventional models, a particular application may be dedicated to each wireless transfer mechanism. Accordingly, when a user selects an application to use to transfer the item, the user also selects the wireless transfer mechanism. However, suppose that the user selects a Bluetooth application only to find that the destination wireless device is not Bluetooth compatible. The user would then select another application, and another, and so on until an appropriate application is found that corresponds to a wireless transfer mechanism that the destination wireless device can use to receive. This can be unduly burdensome to the user.

In accordance with the principles of the present invention, the wireless transfer mechanism to be used becomes less relevant. The available wireless devices are listed in a unified interface so long as the source wireless device is capable of communicating with the potential destination wireless device using any of a number of wireless transfer mechanisms.

Some users may still desire to know the wireless transfer mechanism that is used to transfer an item. Accordingly, visually or audibly distinguishing features may indicate to the user which of the wireless transfer mechanisms were user, or may be used, when communicating with that potential destination wireless device. Accordingly, although the user is not required to select a wireless transfer mechanism, the user may stay apprised of the wireless transfer mechanisms that are available, or that are used.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

Figure 1:
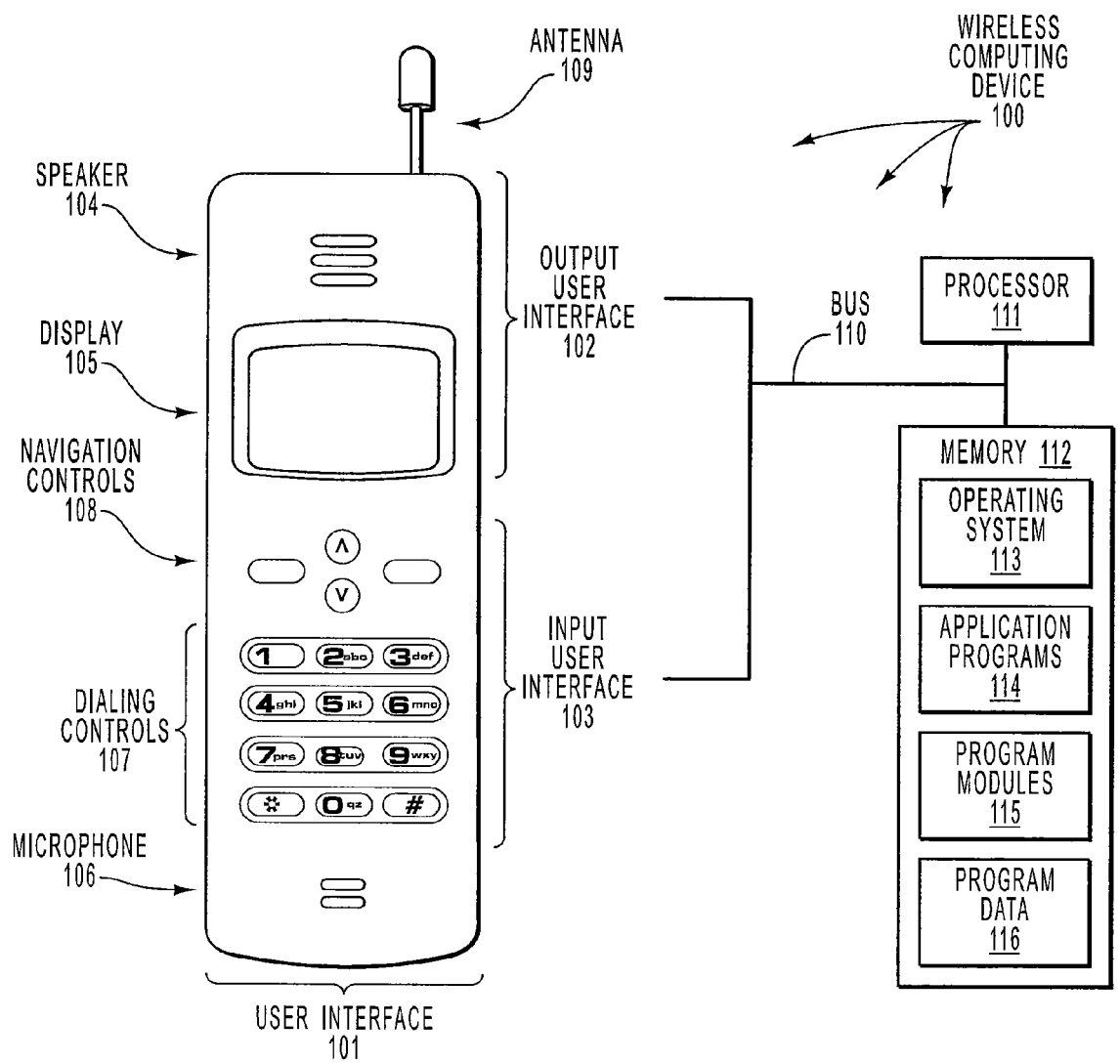
FIG. 1 schematically illustrates a wireless computing device that represents a suitable operating environment for the principles of the present invention.

The present invention extends to methods, systems and computer program products for providing a unified object transfer mechanism in a wireless environment in which multiple wireless transfer mechanisms may be possible. A source wireless device is capable of transmitting items over a wireless network using a number of different wireless transfer mechanism such as, for example, Infra-Red (IR), Bluetooth, or other wireless technologies whether now existing or to be developed in the future. Several potential destination wireless devices may be capable of receiving the item using at least one of the different wireless transfer mechanisms. The user selects one or more destination wireless devices to send items to using a unified user interface that lists the various potential destination wireless devices. After a user selects items to transfer as well as the destination wireless device(s), the wireless transfer mechanism appropriate for transfer to each device is then automatically identified without requiring user selection of the particular wireless transfer mechanism.

The embodiments of the present invention may comprise a special purpose or general purpose computing device including various computer hardware, as discussed in greater detail below. Embodiments within the scope of the present invention also include computer-readable media for carrying or having computer-executable instructions or data structures stored thereon. Such computer-readable media can be any available media which can be accessed by a general purpose or special purpose computer. By way of example, and not limitation, such computer-readable media can comprise physical storage media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer.

When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

Although not required, the invention will be described in the general context of computer-executable instructions, such as program modules, being executed by computing devices. Generally, program modules include routines, programs, objects, components, data structures, and the like that perform particular tasks or implement particular abstract data types.

Those skilled in the art will appreciate that the invention may be practiced in network computing environments with many types of computer system configurations, including personal computers, hand-held devices, multi-processor systems, microprocessor-based or programmable consumer electronics, network PCs, minicomputers, mainframe computers, and the like. The invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

FIG. 1 illustrates a wireless computing device 100 that represents a suitable operating environment for the present invention. The wireless computing device 100 includes a user interface 101 for allowing a user to input information through an input user interface 103, and review information presented via an output user interface 102. For example, the output user interface 102 includes a speaker 104 for presenting audio information to the user, as well as a display 105 for presenting visual information to the user. The wireless computing device 100 also has an antenna 109 for wireless communication with other devices and/or networks.

The input user interface 103 may include a microphone 106 for rendering audio information into electronic form. In addition, the input user interface 103 includes dialing controls 107 represented by 12 buttons through which a user may dial a telephone number, enter a text message, or instruct the wireless computing device 100 to send a data message. Input user interface 103 also includes navigation control buttons 108 that assist the user in navigating through various entries and options that may be listed on display 105.

Although the wireless computing device 100 has the appearance of a mobile telephone, the unseen features of the wireless computing device 100 may allow for complex and flexible general-purpose processing capabilities. For example, the wireless computing device 100 also includes a processor 111 and a memory 112 that are connected to each other and to the user interface 101 via a bus 110. The memory 112 generically represents a wide variety of volatile and/or non-volatile memories that may be employed. The particular type of memory used in the wireless computing device 100 is not important to the present invention.

Program code means comprising one or more program modules may be stored in memory 112. The one of more program modules may include an operating system 113, one or more application programs 114, other program modules 115, and program data 116. The environment illustrated in FIG. 1 is illustrative only, and by no means represents even a small portion of the wide variety of wireless computing devices in which the principles of the present invention may be implemented. For example, PDA's laptop computers, and even non-portable computing devices such as desktop computers may implement the features of the present invention with suitable modification as described herein.

In this description and in the claims, a "wireless device" or "wireless computing device" means any computing device that is capable of sending and/or receiving using at least one wireless transfer mechanism. There is no requirement that such a wireless device be portable, although that may often be the case. Also, there is no requirement that the wireless device only be capable of transferring using wireless transfer mechanisms. Desktop computers may thus be wireless devices as defined for this application as long as the desktop computer is capable of sending and/or receiving using at least one wireless transfer mechanism, even if the desktop computer may also communicate using wired network connections.

Figure 2:
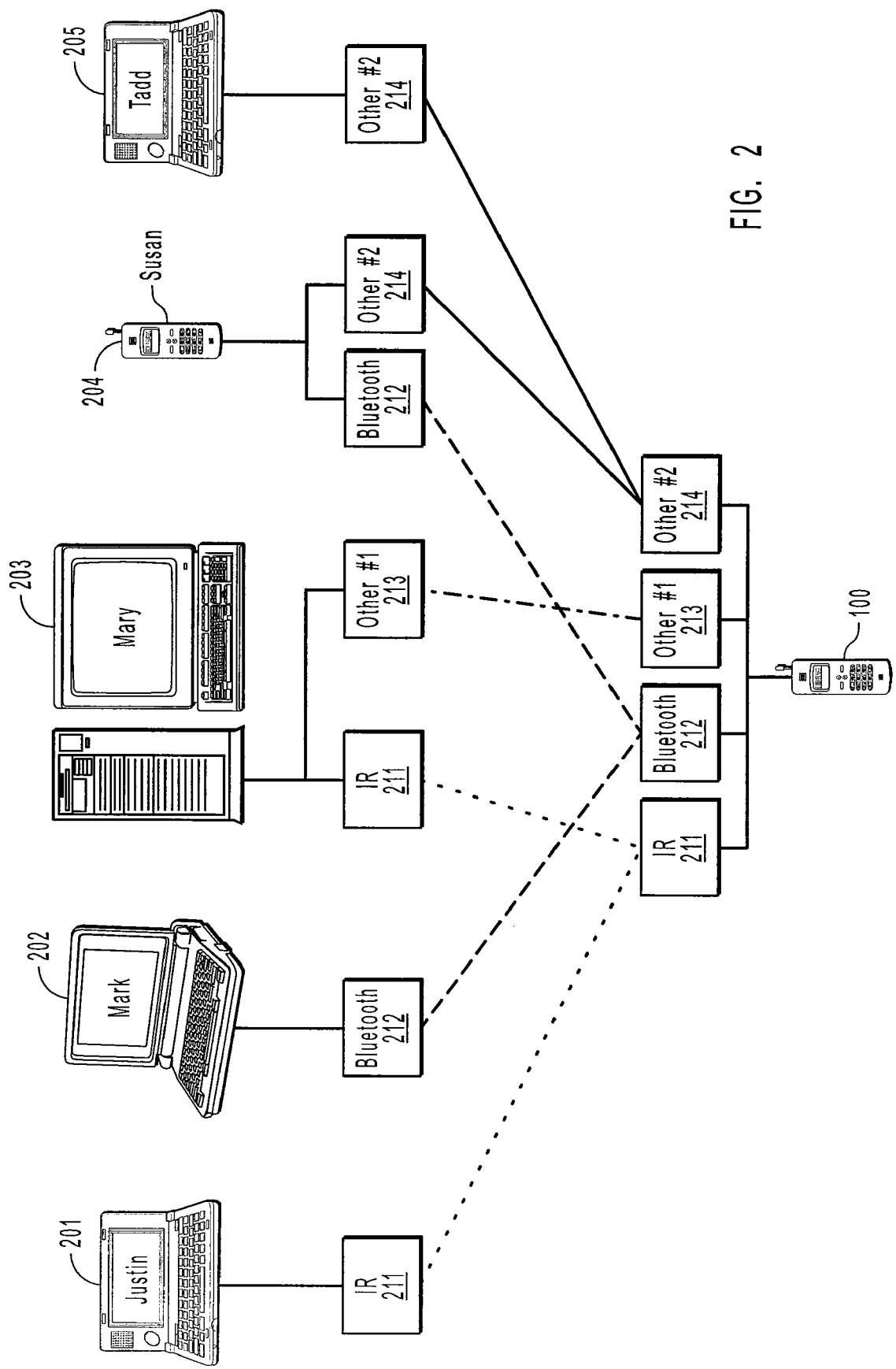
FIG. 2 illustrates an example network environment in which the principles of the present invention may operate.

FIG. 2 illustrates the wireless computing device 100 in an example network environment that also includes wireless computing devices 201 through 205. The example network environment is provided in order to illustrate the principles of the present invention, and not for purposes of defining the scope of the invention. Those of ordinary skill in the art will recognize that there are a host of network environments in which the principles of the present invention may be employed.

In the example of FIG. 2, there are four different types of wireless transfer mechanisms. Two of those wireless transfer mechanisms IR 211 and Bluetooth 212 are expressly named. However, there is also illustrated other wireless transfer mechanism #1 213, and other wireless transfer mechanism #2 214. These other wireless transfer mechanisms 213 and 214 are illustrated to show that the principles of the present invention may be used with a variety of wireless transfer mechanisms (such as "Wi-Fi"), whether now existing or whether they are to be developed in the future.

In the illustrated example, the wireless computing device 100 is capable of transmitting using IR, Bluetooth, Other #1, and Other #2 wireless transfer mechanisms. The other wireless computing devices 201 through 205 also have the capability to perform wireless transfers to one extent or another. For example, the wireless computing device 201 (also known by the alias "Justin") is a Personal Digital Assistant or "PDA" capable of receiving using the IR wireless transfer mechanism 211. The wireless computing device 202 (also known by the alias "Mark") is a laptop computer capable of receiving using the Bluetooth wireless transfer mechanism 212. The wireless computing device 203 (also known by the alias "Mary") is a desktop computer capable of receiving using both the IR wireless transfer mechanism 211 and the Other #1 wireless transfer mechanism 213. The computing device 204 (also known by the alias "Susan") is a mobile telephone capable of receiving using both the Bluetooth wireless transfer mechanism and the Other #2 wireless transfer mechanism 214. The computing device 205 (also known by the alias "Tadd") is a PDA capable of receiving using the Other #2 wireless transfer mechanism 214.

Dotted lines represent the possible communication paths using the IR wireless transfer mechanism 211. Dashed lines represent the possible communication paths using the Bluetooth wireless transfer mechanism 212. Intermittent dotted/dashed lines represent possible communication paths using the Other #1 wireless transfer mechanism 213. Solid lines represent possible communication paths using the Other #2 wireless transfer mechanism 214. The various wireless transfer mechanisms may be implemented by, for example, one or more of the application programs 114 in concert with the operating system 113 of the portable computing device 100.

Not only is this network environment just an example, but this example network environment may change, even frequently, over time. For example, suppose that the user of the wireless telephonic device 100 is wandering through a hallway with the device. Various stationary and wireless computing devices may constantly be moving into and out of the range of the various wireless transfer mechanisms of the wireless computing device 100.

Figure 3:
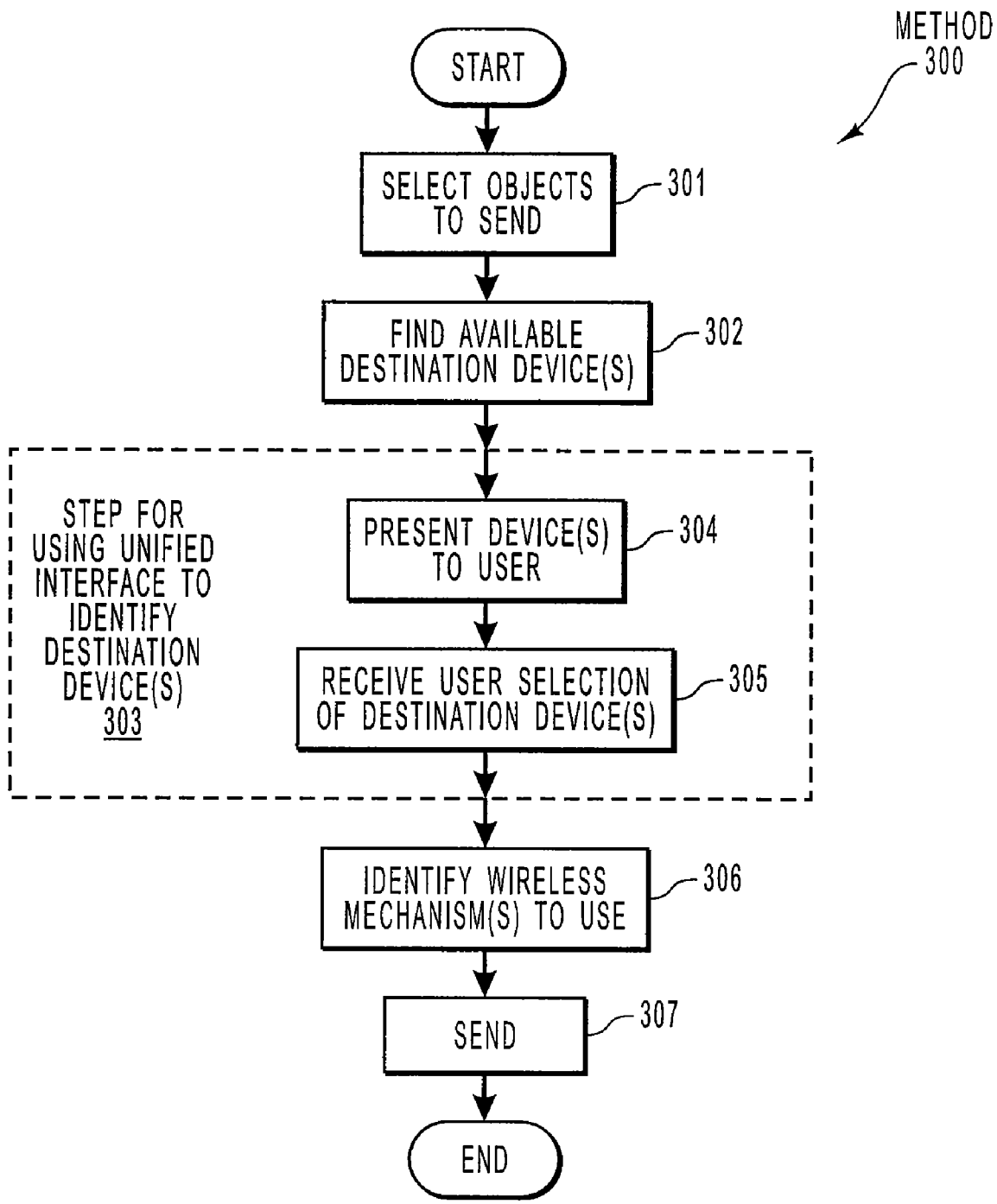
FIG. 3 illustrates a flowchart of a method for transferring objects using one of a plurality of wireless transfer mechanisms without requiring that the user designate a particular transfer mechanism.

FIG. 3 is a flowchart of a method 300 for transferring objects using one of a plurality of wireless transfer mechanisms without requiring that the user designate a particular transfer mechanism. Initially, a user selects objects to send (act 301). The objects may be, for example, calendar entries, task entries, e-mails, documents, or the like.

Then, the method 300 includes finding available destination devices (act 302) that are potential targets for transmitting the selected objects. Many wireless transfer mechanisms including IrOBEX and Bluetooth have there own built-in technology for detecting the local presence of other compatible computing devices. The presence of other computing devices may be detected using these conventional means.

Next, the method 300 includes a step for using a unified user interface to identify one or more destination wireless devices (step 303). This functional result-oriented step may include any corresponding specific acts for accomplishing the result. However, in the embodiment illustrated in FIG. 3, the step for using a unified user interface (step 303) includes corresponding acts 304 and 305.

Specifically, the method 300 presents one or more potential destination wireless devices to a user (act 304) from a unified user interface that lists potential destination wireless devices that are each compatible with one or more of the different wireless transfer mechanisms implemented by the wireless computing device 100.

Figure 4:
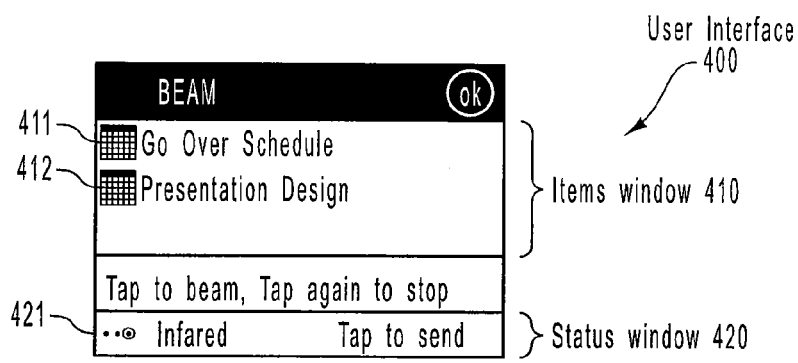
FIG. 4 illustrates an example user interface that includes an upper "items window" showing items that are to be transfer, as well as a lower "status window"

FIG. 4 shows an example of a user interface 400 that includes two windows; an items window 410 for displaying objects that a user has selected to be transmitted, and a status window 420 for displaying available destination devices. The items window 410 illustrates that there are two objects selected for transmission, a "Go Over Schedule" object 411 and a "Presentation Design" Object 412 object. Both appear to be calendar items. At this stage, no destination devices have yet been found. Accordingly, the status window 420 merely has a default entry 421 that states "Infrared Tap to Send".

Figure 5:
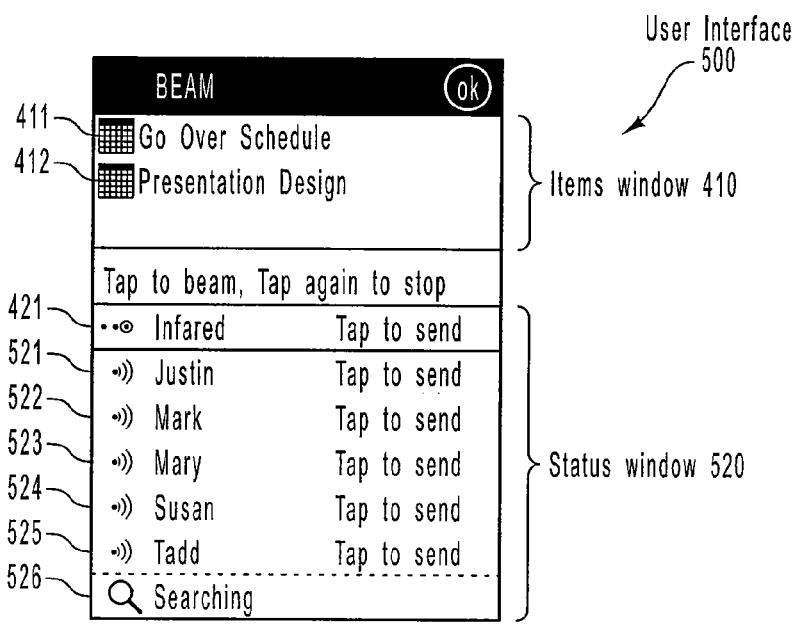
FIG. 5 illustrates an example user interface similar to that shown in FIG. 4, except that the status window indicates that some computing devices have been found.

As mentioned above, the method 300 presents one or more potential destination wireless devices to a user (act 304). FIG. 5 illustrates a user interface 500 that is similar to the user interface 400 of FIG. 4 except that the status window 420 lists several found potential destination computing devices. In particular, there is an entry 521 for Justin, an entry 522 for Mark, an entry 523 for Mary, an entry 524 for Susan, and an entry 525 for Tadd. The found devices entries correspond to the aliases of the various computing devices illustrated in FIG. 2.

As mentioned above, the network of available destination devices may constantly and frequently change due to the flux of wireless devices moving into and out of the range of the wireless computing device 100. Accordingly, the method may continuously search for devices to determine the existing of new devices within range, and to detect the removal of devices from out of the range. Accordingly, a search entry 526 indicates that the search is ongoing.

Once the potential destination wireless devices are displayed to the user (act 304), the method 300 includes receiving a user selection of one or more of the potential destination wireless devices (act 305), thus completing one embodiment of the step for using a unified user interface to identify one or more of the destination wireless devices (step 303). For example, a user may use the navigation control buttons 108 or the dialing controls 107, or any other user input to select the desired destination wireless devices.

The method 300 then includes an act of automatically, and without user intervention, identifying wireless transfer mechanisms to use when transferring the selected items to each of the destination wireless devices (act 306). When the wireless computing device 100 detects the presence of a new wireless computing device within range, the wireless computing device 100 may also detect the wireless transfer mechanisms that the new device is capable of using. For each destination wireless computing device, the wireless computing device 100 may use a set of rules to make a determination of which of the available wireless transfer mechanisms to use. In some case, multiple wireless transfer mechanisms may be used to redundantly transmit the same selected items to the same destination wireless computing device.

The computing device 100 may then determine whether or not it is appropriate to send the one or more items to the selected one or more destination wireless devices. For example, there may be access control constraints that prohibit the sharing of certain items. If appropriate, the method 300 then includes sending then selected items (act 307) to each of the destination wireless devices using the identified wireless transfer mechanism appropriate for each destination wireless device. Accordingly, the selected items have been sent to the destination wireless devices using a single unified user interface and without requiring that the user select a particular wireless transfer mechanism.

Figure 6:
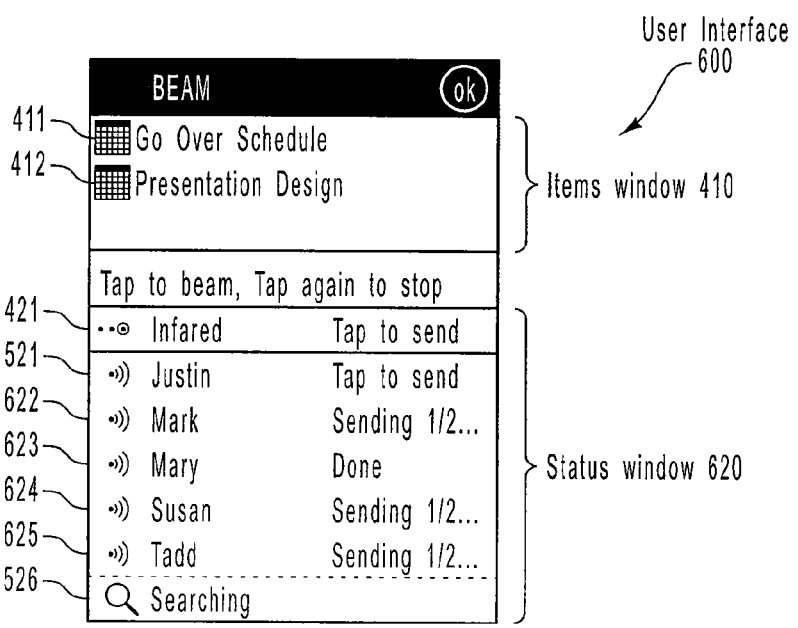
FIG. 6 illustrates an example user interface similar to that shown in FIG. 5, except that the status window indicates various stages of object transfer with respect to some of the found computing devices.

FIG. 6 illustrates an example user interface 600 that is similar to the user interface 500 except that there are four selected destination devices shown; namely, Mark, Mary, Susan, and Tadd. The entry 622 for Mark, the entry 624 for Susan, and the entry 625 for Tadd each shows that the wireless computing device 100 is sending the first of the two selected items to those wireless devices. The entry 623 for Mary indicates that transmission is complete in that both selected items have been sent to the wireless device. The entry 521 for Justin remains unchanged which indicates that Justin was not selected as a destination wireless device.

Optionally, each of the entries in the status window 620 may have some sort of visual feature that indicates the type of wireless transfer mechanisms that are available or preferred for a particular wireless device. Such visual indicators may be by color, font, size, or may be an additional included field that includes an express indicator such as a flag or text that represents the wireless transfer mechanism. Audible features may also identify the wireless transfer mechanism to be used. For example, a chirping sound may be rendered when selecting a destination wireless device that uses IR, and a buzzing sound may be rendered when selecting a destination wireless device that uses Bluetooth. Thus, if the user cares what kind of wireless transfer mechanism is used, the user may still find out the wireless transfer mechanism without being required to do so.

Accordingly, the principles of the present invention allow for the transmission of selected items to one or more destination wireless devices without the user having to designate a particular wireless transfer mechanism. Thus, the user experience in transferring objects to other wireless devices is simplified. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A user interface for facilitating user selection of one or more destination wireless devices to send items to without requiring that the user of the source wireless device identify a wireless transfer technology to use in transferring the items, the user interface comprising:

means for receiving a user selection of one or more items the source wireless device is to send;

means for identifying one or more destination wireless devices that are available to receive items from the source wireless device in response to receiving the user selection of the one or more items the source wireless device is to send;

means for identifying one or more different wireless technologies that each detected locally present destination device is capable of using, and wherein each different wireless technology corresponds to a distinct communication path from the source wireless device to the locally present destination wireless device and such that the one or more items can be transferred from the source wireless device to the locally present destination device in accordance with one or more different wireless transfer technologies over a corresponding one or more distinct communication paths respectively;

means for receiving a user selection of one or more of the identified destination wireless devices and requiring separate user selection of the specific wireless transfer technology for each of the one or more selected locally present destination wireless devices; and means for automatically, and without user intervention, identifying a distinct communication path for each of the one or more selected locally present destination wireless devices in response to the received user selections, each identified distinct communication path corresponding to a wireless technology to use when transferring one or more items to a locally present destination wireless devices.

2. A user interface as recited in claim 1, wherein the means for identifying the one or more destination wireless devices includes modules for detecting the local presence of a plurality of destination wireless devices that are available to receive items in response to receiving the user selection of the one or more items the source wireless device is to send.

3. A user interface as recited in claim 1, wherein the means for identifying the one or more destination wireless devices includes a display of destination wireless devices that are available to receive items in response to receiving the user selection of the one or more items the source wireless device is to send.

4. A user interface as recited in claim 1, wherein said means for identifying the one or more destination wireless devices includes displaying the destination wireless devices with color presentations that are dependant upon which of at least one of the plurality of wireless transfer technologies are available to each of the destination wireless devices.

5. A user interface as recited in claim 1, wherein said means for identifying the one or more destination wireless devices includes displaying the destination wireless devices with font presentations that are dependant upon which of at least one of the plurality of wireless transfer technologies are available to each of the destination wireless devices.

6. A user interface as recited in claim 1, wherein said means for identifying the one or more destination wireless devices includes displaying the destination wireless devices with size distinctions that are dependant upon which of at least one of the plurality of wireless transfer technologies are available to each of the destination wireless devices.

7. A user interface as recited in claim 1, wherein said means for identifying the one or more destination wireless devices includes displaying the destination wireless devices with audible presentations that are dependant upon which of at least one of the plurality of wireless transfer technologies are available to each of the destination wireless devices.

8. A user interface as recited in claim 7, wherein said means for identifying the one or more destination wireless devices includes the use of a chirping sound when a displayed and selected destination wireless device uses IR.

9. A user interface as recited in claim 7, wherein said means for identifying the one or more destination wireless devices includes the use of a buzzing sound when a displayed and selected destination wireless device uses Bluetooth.

10. A user interface as recited in claim 1, further including means for identifying the one or more items to be sent based on the receipt of a user selection of the one or more items.

11. A user interface as recited in claim 1, wherein the plurality of wireless transfer technologies includes one or more infrared wireless transfer technologies.

12. A user interface as recited in claim 1, wherein the user interface obscures at least one of the plurality of wireless transfer technologies available for a detected destination wireless device from user view.

13. A user interface as recited in claim 1, wherein said means for identifying the one or more different wireless technologies includes a use of visually distinguishable features for distinguishing different wireless transfer technologies.

* * * * *